（12）United States Patent
Nakanishi

(10) Patent No.: US 6,740,975 B2
(45) Date of Patent: May 25, 2004

(54) WIRING SUBSTRATE HAVING NO THROUGH HOLES FORMED IN WIRING CORRESPONDENCE REGIONS

(75) Inventor: Naoya Nakanishi, Aichi (JP)

(73) Assignee: NGK Spark Plug Company, Limited, Aichi (JP)

( * ) Notice: Subject to any disclaimer, the term of this patent is extended or adjusted under 35 U.S.C. 154(b) by 0 days.

(21) Appl. No.: 10/126,693

(22) Filed: Apr. 22, 2002

(65) Prior Publication Data

US 2002/0153611 A1 Oct. 24, 2002

(30) Foreign Application Priority Data

Apr. 24, 2001 (JP) .......................... 2001-126273

(51) Int. Cl.[7] .............................................. H01L 23/52
(52) U.S. Cl. ...................... 257/758; 257/700; 257/773; 257/774; 257/691
(58) Field of Search ................................. 257/774, 701, 257/700, 758, 668, 691, 664, 662, 698, 773, 203, 207, 208, 209, 210, 211

(56) References Cited

U.S. PATENT DOCUMENTS

| 4,328,531 | A | * | 5/1982 | Nagashima et al. | ......... | 361/762 |
| 4,816,323 | A | * | 3/1989 | Inoue | .......... | 428/210 |
| 5,955,762 | A | * | 9/1999 | Hively | ........ | 257/355 |
| 6,028,364 | A | * | 2/2000 | Ogino et al. | ........ | 257/778 |
| 6,171,946 | B1 | * | 1/2001 | Tsukamoto | ........ | 438/623 |
| 6,423,571 | B2 | * | 7/2002 | Ogino et al. | ........ | 438/106 |

* cited by examiner

Primary Examiner—Nathan J. Flynn
Assistant Examiner—Pershelle Greene
(74) Attorney, Agent, or Firm—Sughrue Mion, PLLC

(57) ABSTRACT

A wiring substrate has signal transmission paths in a strip line structure implemented through sandwiching of signal wiring layers between first and second conductor layers via first and second dielectric layers. Through holes are formed in the first conductor layer. The through holes are not formed in wiring correspondence regions, which correspond to the signal wiring layers as projected onto the first conductor layer in the thickness direction of the first conductor layer. All of the through holes are formed in a wiring noncorrespondence region, which is the remaining portion of the first conductor layer not including the wiring correspondence regions.

8 Claims, 6 Drawing Sheets

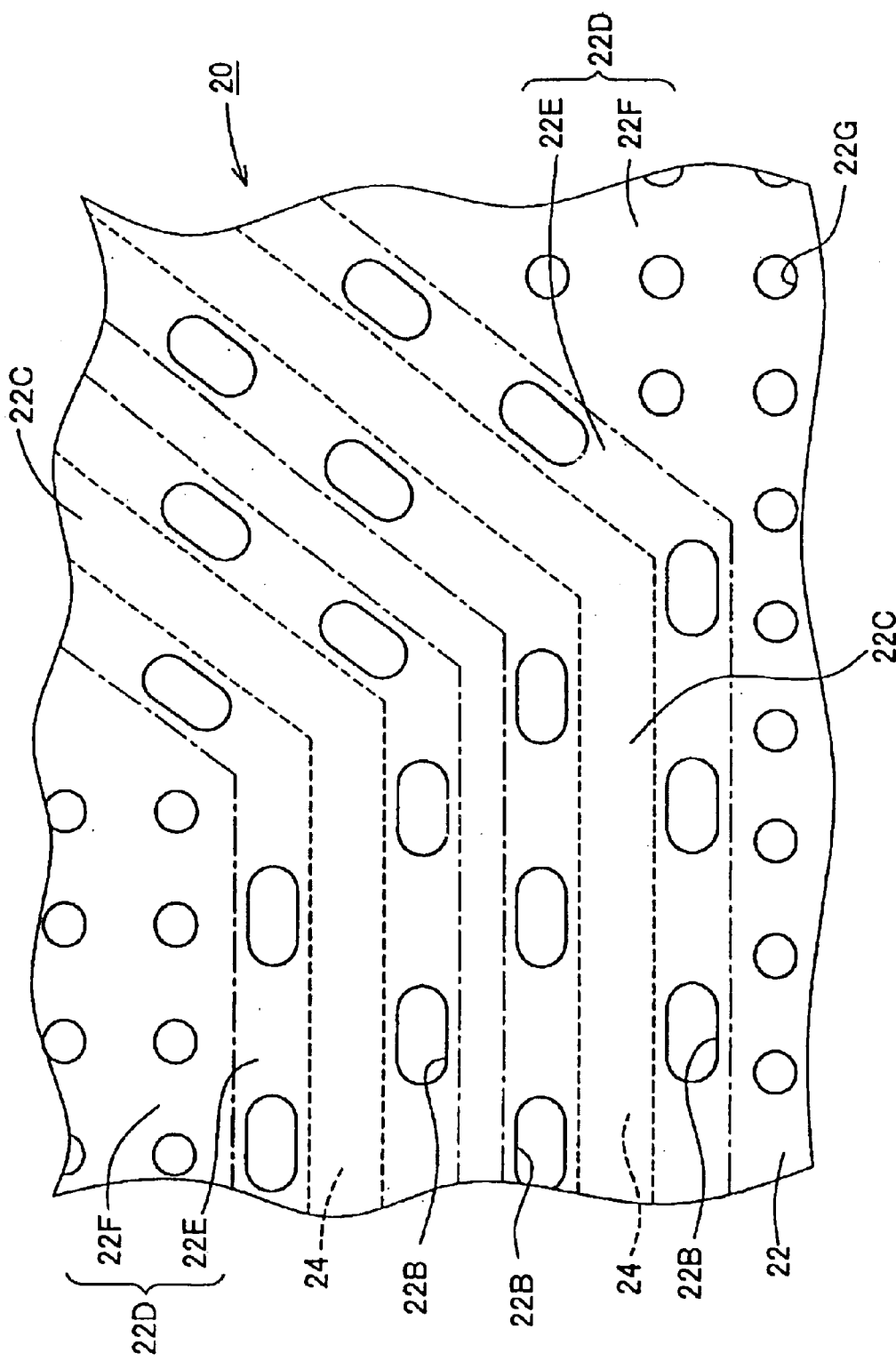

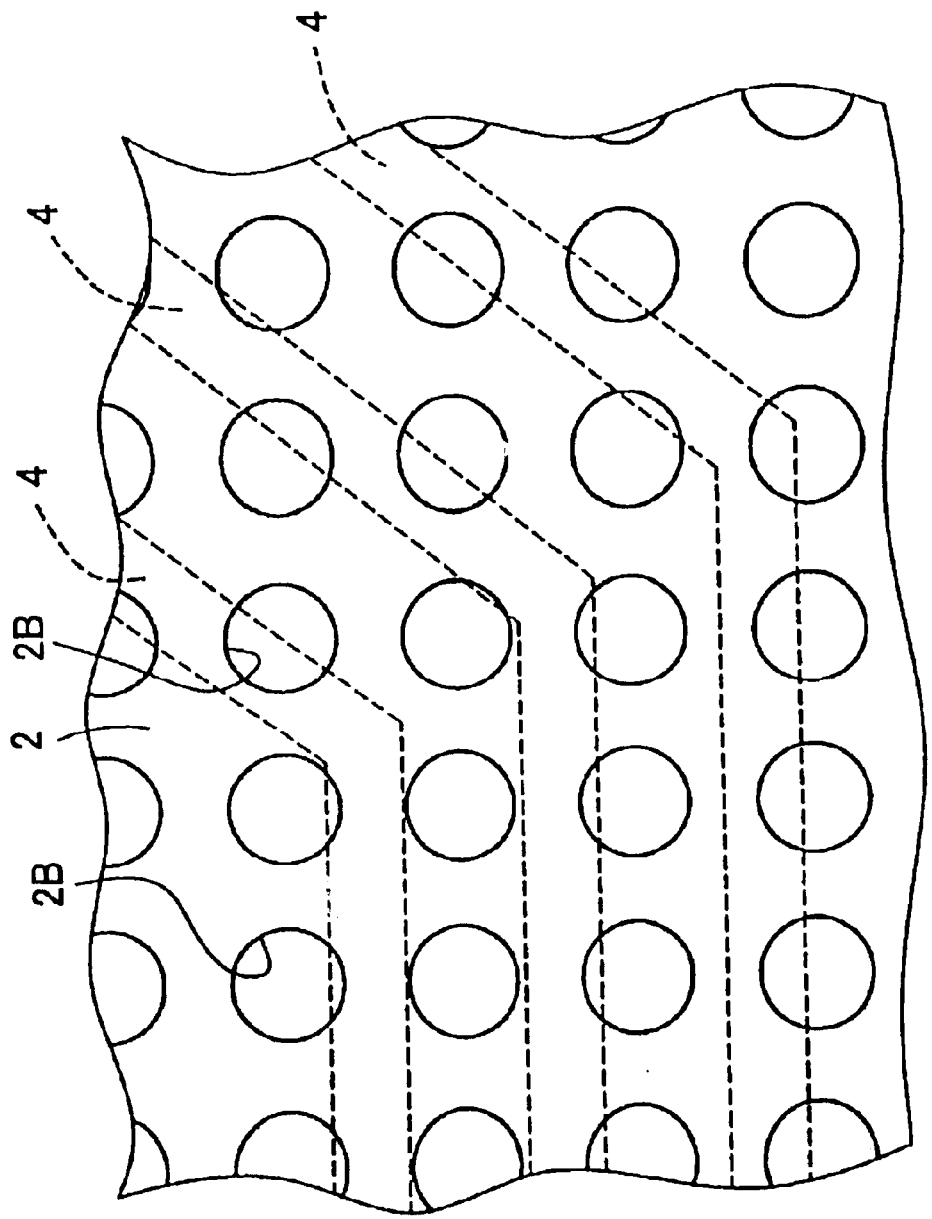

WIRING SUBSTRATE HAVING NO THROUGH HOLES FORMED IN WIRING CORRESPONDENCE REGIONS

BACKGROUND OF THE INVENTION

1. Field of the Invention

The present invention relates to a wiring substrate, and more particularly to a wiring substrate in which a signal wiring layer and a conductor layer are electromagnetically coupled via a dielectric layer for the purpose of transmitting a signal.

2. Description of the Related Art

There are known wiring substrates configured such that a dielectric layer(s), a signal wiring layer(s), a solid conductor layer(s), and other layers are arranged in an alternating fashion. Among such wiring substrates, those involving transmission of a high-frequency signal may assume a strip line structure or a microstrip line structure in which a signal wiring layer and a solid conductor layer are electromagnetically coupled so as to serve as a signal transmission path.

When a wiring substrate is configured such that the dielectric layers and the large-area conductor layers, such as solid conductor layers, are arranged in an alternating fashion, a number of circular or rectangular through holes are often formed in the conductor layers at predetermined intervals, such as in a lattice pattern, or meshed so as to directly connect the upper and lower dielectric layers through the through holes (or mesh).

There are many conventional reasons for connecting the upper and lower dielectric layers directly together through the through holes provided in the conductor layer. The first reason is that the bonding strength between dielectric layers, which are formed from ceramics (e.g., alumina) and/or resins (e.g., epoxy resin), is greater than that between a dielectric layer and a conductor layer, which is formed from metal (e.g., tungsten, molybdenum, copper, or silver). Therefore, the direct bonding of the dielectric layers through the through holes of the conductor layer increases the strength of the wiring substrate. The second reason is that a conductor layer has poorer gas release properties than a dielectric layer, which is especially important during firing, curing, thermal treatment, and other processes performed during manufacture of the wiring substrate. Therefore, during the course of such treatments or processes, a conductor layer having a large area is likely to hinder diffusion of gas released from an underlying dielectric layer or conductor layer. This gas release phenomenon may generate blisters between a dielectric layer and a conductor layer in contact with the dielectric layer, which reduces the bonding strength between the layers of the wiring substrate.

For these reasons, the conventional wisdom is to provide a conductor layer, which is electromagnetically coupled with a signal wiring layer, with a number of through holes to maintain the bonding strength with a dielectric layer and to prevent the generation of blisters.

Although the conventional wiring substrate is generally thought to be acceptable, it is not without shortcomings. Namely, when a conductor layer (which is to be electromagnetically coupled with a signal wiring layer) has a number of through holes formed therein or is meshed as shown in FIG. 6, for example, the through holes are located at portions of the conductor layer that face the signal wiring layers. That is, and with reference to FIG. 6, when a conductor layer 2 having through holes 2B and signal wiring layers 4 (shown in phantom) are arranged together, the conductor layer 2 and the signal wiring layers 4 overlap. However, the through holes 2B and the signal wiring layers 4 also overlap.

The signal wiring layers 4 differ in characteristic impedance between the case where the conductor layer 2 and the signal wiring layers 4 overlap and the case where the through holes 2B and the signal wiring layers 4 overlap. Thus, when a single signal wiring layer 4 is examined for characteristics along its longitudinal direction, the signal wiring layer 4 shows local variations in characteristics, such as characteristic impedance. As a result, a signal transmitted through the signal wiring layer 4 suffers reflection, distortion, and other similar defects that potentially result in delays or errors in the signal transmission.

SUMMARY OF THE INVENTION

The present invention overcomes the shortcomings associated with conventional wiring substrates. An object of the present invention is to provide a wiring substrate that exhibits improved bonding strength and reliability, and in which variations in characteristics, such as characteristic impedance, are restrained with respect to signal wiring layers.

To achieve the above objects, the present invention provides a wiring substrate having a layered structure comprising a conductor layer having a plurality of through holes formed therein, a dielectric layer in contact with the conductor layer; and a signal wiring layer positioned in opposition to the conductor layer via the dielectric layer. The signal wiring layer is adapted to transmit a signal. The conductor layer includes (1) a wiring correspondence region corresponding to the signal wiring layer as projected onto the conductor layer in a thickness direction of the conductor layer, and (2) a wiring noncorrespondence region, which is the remaining portion of the conductor layer not including the wiring correspondence region. The through holes are arranged in the wiring noncorrespondence region of the conductor layer.

In the wiring substrate of the present invention, the through holes are formed in the wiring noncorrespondence region of the conductor layer remaining after removal of the wiring correspondence region. Since the signal wiring layer is electromagnetically coupled with the wiring correspondence region, in which no through holes are provided, the signal wiring layer is not prone to characteristic variations in electromagnetic coupling as observed along the longitudinal direction of the signal wiring layer. Thus, local variations in characteristics, such as characteristic impedance, can be restrained with respect to the signal wiring layer.

Notably, no particular limitation is imposed on the configuration of the wiring substrate so long as the signal wiring layer and the conductor layer are arranged in layers in such a manner as to face each other via the dielectric layer. The present invention includes, for example, the following configurations: a conductor layer underlies a signal wiring layer via a dielectric layer; and a signal wiring layer underlies a conductor layer via a dielectric layer. The present invention further includes a configuration, such as a strip line structure, in which a signal wiring layer is sandwiched between two conductor layers.

Preferably, the above-described wiring substrate is configured such that at least one of the through holes are formed in a side portion of the wiring noncorrespondence region, which is located in the vicinity of and along the wiring correspondence region.

As mentioned previously, the configuration in which the through holes are not formed in the wiring correspondence region restrains variations in characteristic impedance and like characteristics. Also, in the wiring substrate of the present invention, the through holes are formed in a side portion of the wiring noncorrespondence region which extends along the wiring correspondence region. Thus, regions in the vicinity of the through holes (i.e., the regions including the wiring correspondence region) exhibit, among other properties, good gas release properties and strong bonding between the upper and lower dielectric layers, thereby preventing generation of blisters in the wiring correspondence region of the conductor layer, and thus imparting high reliability to the wiring substrate.

Preferably, the above-described wiring substrate is configured such that the through holes formed in the side portion are elongated in a direction substantially parallel to the length direction of the signal wiring layer rather than along a direction perpendicular to the length direction.

In the wiring substrate of the present invention, the through holes have an elongated shape; thus, the through holes formed in the side portion located in the vicinity of the wiring correspondence region can assume a relatively large opening area as compared with circular or square through holes. Therefore, although through holes are not formed in the wiring correspondence region, regions in the vicinity of the through holes (i.e., the regions including the wiring correspondence region) can exhibit, among other properties, particularly good gas release properties, thereby reliably preventing generation of blisters or occurrence of a like defect.

The shape of an elongated through hole is not particularly limited so long as the through hole is longer along the direction substantially parallel to the length direction of the signal wiring layer than along the direction perpendicular to the length direction. Specific examples of the form of an elongated through hole include an elongated circle, an oval, and an elongated rectangle.

In another aspect of the present invention, the wiring substrate includes a conductor layer having a plurality of through holes formed therein, a dielectric layer in contact with the conductor layer, and a plurality of signal wiring layers positioned in opposition to the conductor layer via the dielectric layer. The signal wiring layers are adapted to transmit signals. The conductor layer includes (1) a plurality of wiring correspondence regions corresponding to the plurality of signal wiring layers as projected onto the conductor layer in the thickness direction of the conductor layer, and (2) a wiring noncorrespondence region, which is the remaining portion of the conductor layer after removal of the wiring correspondence regions. The through holes are arranged in the wiring noncorrespondence region of the conductor layer. The signal wiring layers include parallel wiring portions extending in parallel with one another and located adjacent to one another. The wiring correspondence regions include parallel wiring correspondence portions corresponding to the parallel wiring portions. The wiring noncorrespondence region includes parallel-wiring-gap correspondence portions respectively interposed between the parallel wiring correspondence portions. The through holes arranged in the parallel-wiring-gap correspondence portions are elongated in a direction substantially parallel to the length direction of the parallel wiring portions of the signal wiring layers rather than along a direction perpendicular to the length direction.

In the wiring substrate of the present invention, the through holes are formed in the wiring noncorrespondence region of the conductor layer. Since the signal wiring layer is electromagnetically coupled with the wiring correspondence regions, in which through holes are absent, the signal wiring layer is not prone to characteristic variations in electromagnetic coupling along the longitudinal direction of the signal wiring layers. Thus, local variations in characteristics, such as characteristic impedance, can be restrained with respect to the signal wiring layers.

When a wiring substrate is configured such that signal wiring layers comprise parallel wiring portions extending in parallel with one another, parallel-wiring-gap correspondence portions of a conductor layer are each interposed between parallel wiring correspondence portions; thus, limitations are imposed on the position where through holes are to be formed and the width of a region where through holes are to be formed. Accordingly, circular or square through holes may fail to provide a required size (opening area) when formed in the parallel-wiring-gap correspondence portions.

According to the present invention, the through holes arranged in the parallel-wiring-gap correspondence portions are elongated. The width of the individual parallel-wiring-gap correspondence portions limits the through holes to be formed in the parallel-wiring-gap correspondence portions with respect to a dimension as measured along the direction perpendicular to the length direction of the parallel wiring portions (or the parallel wiring correspondence portions of the wiring correspondence regions), whereas no limitation is imposed on a dimension as measured in the direction parallel to the length direction of the parallel wiring portions. The elongated through holes of the present invention can assume a relatively large opening area in the parallel-wiring-gap correspondence portions adjacent to the parallel wiring correspondence portions. Accordingly, regions in the vicinity of the through holes (i.e., the regions including the parallel wiring correspondence regions) can exhibit, among other properties, particularly good gas release properties and strong bonding between the upper and lower dielectric layers, thereby reliably preventing the generation of blisters or the occurrence of similar defects.

Preferably, the above-described wiring substrate is configured such that elongated through holes located on opposite sides of a certain parallel wiring correspondence portion are staggered along the length direction of the parallel wiring portions.

When elongated through holes on opposite sides of a certain parallel wiring correspondence portion are arranged in a laterally aligned condition with respect to a certain parallel wiring correspondence portion, the aligned through holes define a narrow gap therebetween (i.e., the through holes narrow a path of current flowing through the conductor layer, raising a problem in that the resistance of the conductor layer increases locally).

By contrast, the wiring substrate of the present invention is configured such that elongated through holes located on opposite sides of a certain parallel wiring correspondence portion are staggered (i.e., adjacent elongated through holes sandwiching a corresponding parallel wiring corresponding portion are arranged in a staggered manner in the length direction). Thus, the gap defined between staggered through holes on opposite sides of a parallel wiring correspondence portion is not narrowed, thereby lowering resistance at such portions of the conductor layer.

Preferably, the above-described wiring substrate is configured such that a gap is formed along the above-mentioned length direction between adjacent through holes located on opposite sides of a parallel wiring correspondence portion.

In the wiring substrate of the present invention, a gap is formed along the above-mentioned length direction between the staggered, elongated through holes. That is, elongated through holes are formed in the conductor layer such that no portion of the conductor layer is interposed between through holes located on opposite sides of a parallel wiring correspondence portion as observed along the length direction.

In yet another aspect of the present invention, the wiring substrate having a layered structure includes a conductor layer having a plurality of through holes formed therein, a dielectric layer in contact with the conductor layer, and a plurality of signal wiring layers positioned in opposition to the conductor layer via the dielectric layer. The signal wiring layers are adapted to transmit a signal. The conductor layer includes (1) a plurality of wiring correspondence regions corresponding to the plurality of signal wiring layers as projected onto the conductor layer in the thickness direction of the conductor layer, and (2) a wiring noncorrespondence region, which is the remaining portion of the conductor layer after removal of the wiring correspondence regions. The through holes are arranged in the wiring noncorrespondence region of the conductor layer. The signal wiring layers include (1) first parallel wiring portions extending in parallel with one another such that a first gap is formed between the adjacent first parallel wiring portions, and (2) second parallel wiring portions extending in parallel with one another while forming a predetermined angle with respect to the first parallel wiring portions and such that a second gap greater than the first gap is formed between the adjacent second parallel wiring portions. The wiring correspondence regions include (1) first parallel wiring correspondence portions corresponding to the first parallel wiring portions, and (2) second parallel wiring correspondence portions corresponding to the second parallel wiring portions. The wiring noncorrespondence region includes (1) first parallel-wiring-gap correspondence portions that are interposed between the first parallel wiring correspondence portions, and (2) second parallel-wiring-gap correspondence portions each being interposed between the second parallel wiring correspondence portions. The through holes that are arranged in the first parallel-wiring-gap correspondence portions are first through holes that have a shape that is elongated in a direction substantially parallel to the first length direction along the first parallel wiring portions of the signal wiring layers rather than along a direction perpendicular to the first length direction. The through holes that are arranged in the second parallel-wiring-gap correspondence portions are second through holes that have a shape that is elongated in a direction substantially parallel to the second length direction along the second parallel wiring portions of the signal wiring layers rather than along a direction perpendicular to the second length direction. Also, the second through holes have an opening area greater than that of the first through holes.

In the wiring substrate of the present invention, the through holes are formed in the wiring noncorrespondence region of the conductor layer remaining after removal of the wiring correspondence regions. Since the signal wiring layer is electromagnetically coupled with the wiring correspondence regions, in which through holes are absent, the signal wiring layer is not prone to characteristic variations in electromagnetic coupling as observed along the longitudinal direction of the signal wiring layers. Thus, local variations in characteristics, such as characteristic impedance, can be restrained with respect to the signal wiring layers.

For a wiring substrate configured to have first and second parallel wiring portions, the first parallel-wiring-gap correspondence portions and the second parallel-wiring-gap correspondence portions of the conductor layer are respectively interposed between the first parallel wiring correspondence portions or between the second parallel wiring correspondence portions. Thus, limitations are imposed on the position where the through holes are to be formed and the width of a region where through holes are to be formed. Accordingly, circular or square through holes may fail to provide a required size (opening area) when formed in the first parallel-wiring-gap correspondence portions and the second parallel-wiring-gap correspondence portions.

According to the present invention, the through holes arranged in the first parallel-wiring-gap correspondence portions and the second parallel-wiring-gap correspondence portions are implemented as the first elongated through holes or the second elongated through holes, to thereby assume a relatively large opening area as compared with through holes in a circular or like shape. Therefore, regions located in the vicinity of the first elongated through holes and the second elongated through holes (i.e., the regions including the first parallel wiring correspondence regions and the second parallel wiring corresponding regions) can exhibit, among other properties, particularly good gas release properties and strong bonding between the upper and lower dielectric layers, thereby reliably preventing the generation of blisters and the occurrence of other similar defects.

The first parallel wiring correspondence portions correspond to the first parallel wiring portions arranged at intervals of a first gap, whereas the second parallel wiring correspondence portions correspond to the second parallel wiring portions arranged at intervals of a second gap greater than the first gap. Accordingly, the second parallel-wiring-gap correspondence portions are arranged at intervals wider than those at which the first parallel-wiring-gap correspondence portions are arranged. Therefore, if the second elongated through holes assume the same size as the first elongated through holes, an increase in interval is accompanied by a relative reduction in opening area per unit of area (opening percentage), with the result that blisters tend to be generated due to impaired gas release properties.

According to the present invention, the second elongated through holes arranged in the second parallel-wiring-gap correspondence portions assume an opening area greater than that of the first elongated through holes, whereby a reduction in opening percentage is prevented. Therefore, in either the first parallel-wiring-gap correspondence portions or the second parallel-wiring-gap correspondence portions, the generation of blisters and the occurrence of other similar defects can be further reliably prevented in the vicinity of the first elongated through holes or the second elongated through holes (including the first parallel wiring correspondence portions and the second parallel wiring correspondence portions).

The above and other features of the invention including various and novel details of construction and combination of parts will now be more particularly described with reference to the accompanying drawings and pointed out in the claims. It will be understood that the particular wiring substrate embodying the invention is shown by way of illustration only and not as a limitation of the invention. The principles and features of this invention may be employed in varied and numerous embodiments without departing from the scope of the invention.

BRIEF DESCRIPTION OF THE DRAWINGS

FIG. 5 is a partially enlarged sectional view showing in a planar form a portion of a conductor layer of a wiring substrate according to Embodiment 2; and FIG. 6 is an explanatory view showing the relationship between signal wiring layers and a conductor layer having through holes formed therein for the purpose of explaining problems to be solved by the present invention.

DETAILED DESCRIPTION OF THE INVENTION

Embodiment 1

A first embodiment of the present invention is depicted in FIGS. 1 to 4.

Figure 1:
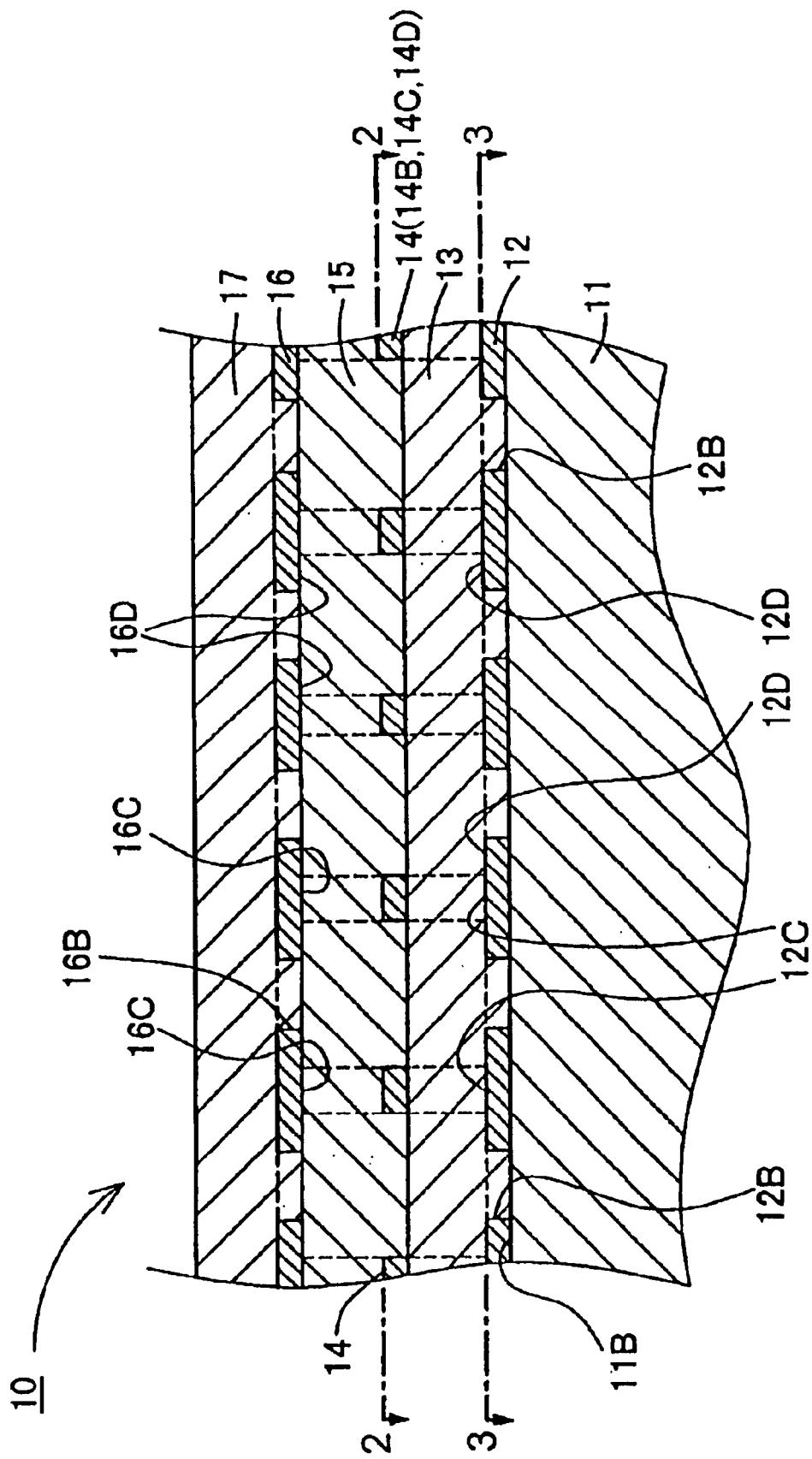
FIG. 1 is a partially enlarged sectional view (taken along line 1—1 in FIG. 3) of a wiring substrate according to Embodiment 1.

With reference to FIG. 1, a wiring substrate 10 is configured such that metal layers, such as conductor layers and signal wiring layers, formed of Cu and having a thickness of about 20 $\mu$m and resin dielectric layers formed of epoxy resin and having a thickness of about 35 $\mu$m are arranged in an alternating fashion on the front and back surfaces of a core substrate 11. The core substrate is formed from a glass-epoxy-resin composite material and has a thickness of about 600 $\mu$m. Notably, the present embodiment will be described with respect to only the front side thereof illustrated in FIG. 1, and the illustration and description of the back side are omitted.

On a front surface 11B of the core substrate 11, a first conductor layer 12 (which is to be grounded, thereby forming a ground plane), a first dielectric layer 13, a plurality of signal wiring layers 14, a second dielectric layer 15, a second conductor layer 16 (which is to be supplied with a positive supply potential, thereby forming a power plane), and a third dielectric layer 17 are arranged in layers in this order.

The wiring substrate 10 having the illustrated sectional structure is configured such that the signal wiring layers 14 are sandwiched between the first and the second conductor layers 12, 16 via the first and the second dielectric layers 13 and 15. The signal wiring layers 14 are electromagnetically coupled with the first and the second conductor layers 12, 16, thus forming signal transmission paths in a so-called strip line structure for the purpose of transmitting signals by means of the signal wiring layers 14.

Figure 2:
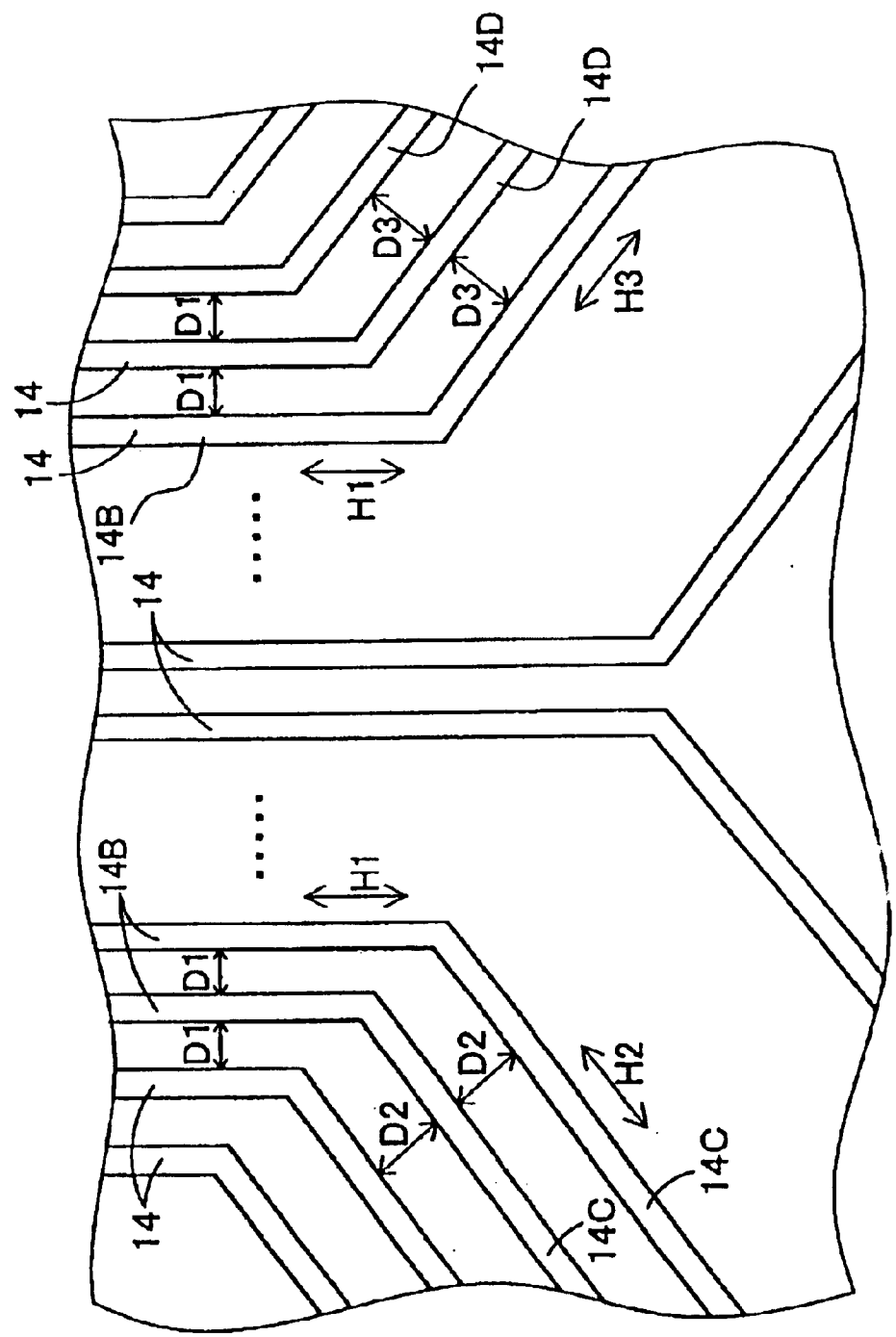
FIG. 2 is a partially enlarged sectional view (taken along line 2—2 in FIG. 1) showing in a planar form the signal wiring layers of the wiring substrate.

The signal wiring layers 14 are shown in a planar form in FIG. 2. FIG. 2 is a sectional view taken along the line 2—2 in FIG. 1. The wiring substrate 10 includes a number of signal wiring layers 14. The signal wiring layers 14 (which are positioned to the left) include first parallel wiring portions 14B, which extend in parallel with one another in a first direction H1 (the vertical direction in FIG. 2) such that a first gap D1 is formed between the adjacent first parallel wiring portions 14B. The signal wiring layers 14 further include second parallel wiring portions 14C, which extend in parallel with one another from respective ends of the first parallel wiring portions 14B. The second parallel wiring portions 14C form a predetermined angle (about 45 degrees in the present embodiment) with respect to the first parallel wiring portions 14B. A second gap D2, which is greater than the first gap D1, is formed between adjacent second parallel wiring portions 14C. The second parallel wiring portions 14C have widths that are substantially equal to those of the first parallel wiring portions 14B.

As shown at the right of FIG. 2, some of the signal wiring layers 14 (positioned to the right) include the first parallel wiring portions 14B and third parallel wiring portions 14D. The third parallel wiring portions 14D extend in parallel with one another from respective ends of the first parallel wiring portions 14B. The third parallel wiring portions 14D form a predetermined angle (about 45 degrees in the present embodiment) with respect to the first parallel wiring portions 14B. A third gap D3, which is greater than the first gap D1, is formed between the adjacent third parallel wiring portions 14D. Also, in these signal wiring layers 14, the first parallel wiring portions 14B and the third parallel wiring portions 14D have substantially the same width.

The pattern of the signal wiring layers 14 as shown in FIG. 2 is employed (for example) by a wiring substrate which carries an IC chip having a number of signal terminals at a peripheral portion thereof, for the purpose of fanning out the signal terminals arranged at narrow intervals by means of the signal wiring layers 14 in order to provide signal terminals arranged at widened intervals, to thereby enable connection to a mother board or the like.

Figure 3:
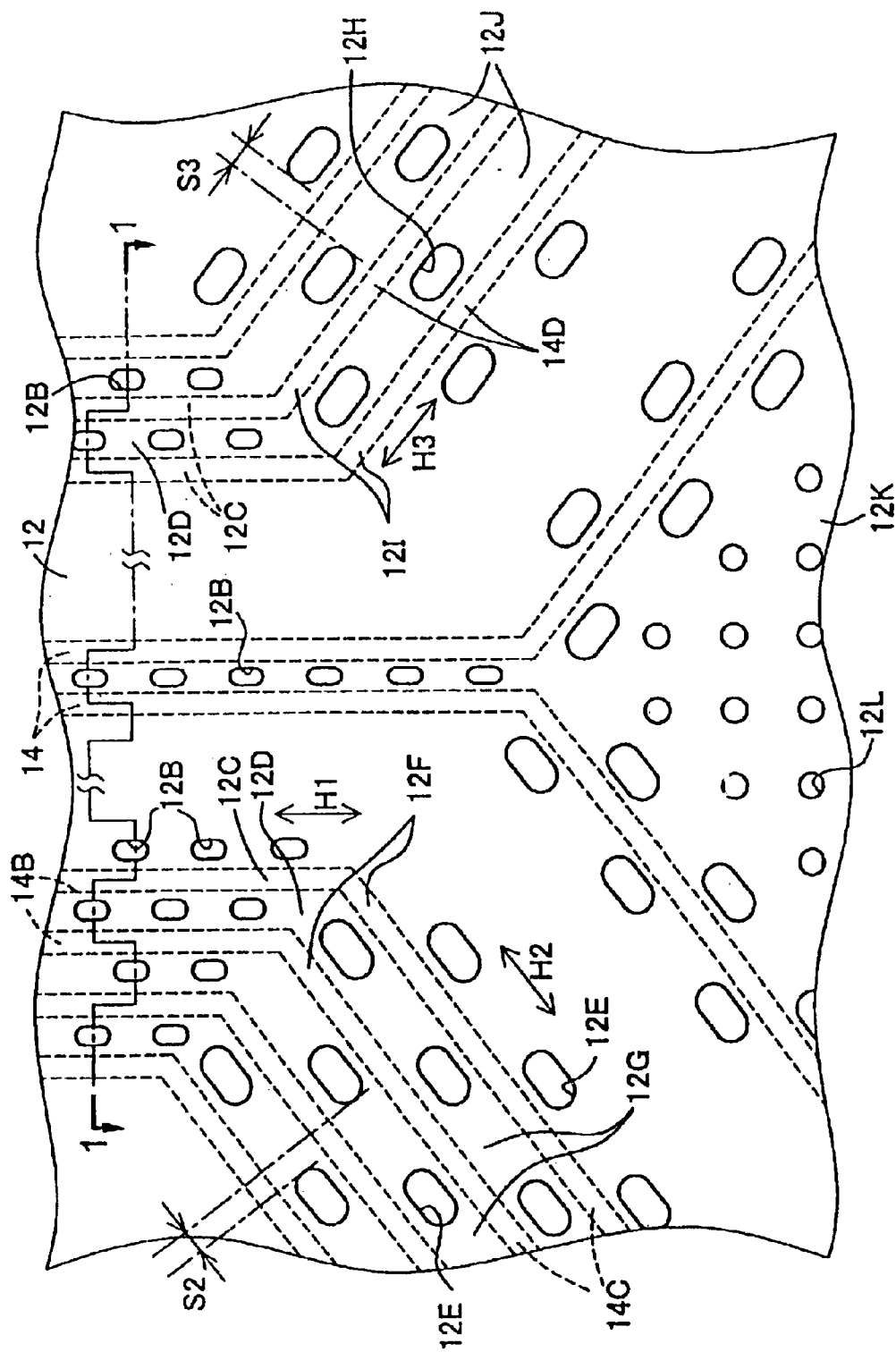
FIG. 3 is a partially enlarged sectional view (taken along line 3—3 in FIG. 1) showing in a planar form the first conductor layer of the wiring substrate.

The first conductor layer 12 is shown in a planar form in FIG. 3. The first conductor layer 12 is a solid conductor layer and has a number of through holes 12B, 12E, 12H, and 12L formed therein. The through holes 12B are formed to directly connect the core substrate 11 and the first dielectric layer 13 therethrough, thereby enhancing the strength of the wiring substrate 10. The through holes are also intended to allow release of gas therethrough. Specifically, in fabricating the wiring substrate 10, gas that is generated from the core substrate 11 as a result of repeated application of heat (e.g., during curing of the first dielectric layer 13), is released to the exterior of the wiring substrate 10 through the through holes to prevent generation of blisters at the interface between the core substrate 11 and the first conductor layer 12.

The through holes may be arranged regularly (such as in a lattice pattern) at a residual portion 12K of the first conductor layer 12. See for example the circular through holes 12L. However, to cope with the previously mentioned problems associated with the conventional wiring substrate (i.e., taking into consideration the relationship between the through holes and the signal wiring layers 14), the present wiring substrate 10 employs the through holes 12B, 12E, and 12H. Notably, the core substrate 11 is exposed within all of the through holes 12B, 12E, 12H, and 12L.

As represented by dashed lines in FIG. 3, the first conductor layer 12 is divided into (1) a wiring correspondence region, which corresponds to the signal wiring layers 14 as projected thereon along the thickness direction (i.e., perpendicular to the drawing sheet), and (2) a remaining wiring noncorrespondence region.

The wiring correspondence region includes (1) first parallel wiring correspondence portions 12C corresponding to the first parallel wiring portions 14B of the signal wiring layers 14, (2) second parallel wiring correspondence portions 12F corresponding to the second parallel wiring portions 14C, and (3) third parallel wiring correspondence portions 12I corresponding to the third parallel wiring portions 14D.

The wiring noncorrespondence region includes (1) first parallel-wiring-gap correspondence portions 12D interposed between the first parallel wiring correspondence portions 12C, (2) second parallel-wiring-gap correspondence portions 12G interposed between the second parallel wiring correspondence portions 12F, (3) third parallel-wiring-gap correspondence portions 12J interposed between the third parallel wiring correspondence portions 12I, and (4) the residual portion 12K.

The through holes 12B, 12E, 12H, and 12L are formed in the wiring noncorrespondence region.

First, the first parallel wiring correspondence portions 12C and the first parallel-wiring-gap correspondence portions 12D will be discussed.

As shown in FIG. 3, first elongated through holes 12B are formed in the first parallel-wiring-gap correspondence portions 12D. The elongated through holes 12B are interposed between the first parallel wiring correspondence portions 12C. That is, no through holes are formed in the first parallel wiring correspondence portions 12C, which correspond to the first parallel wiring portions 14B of the signal wiring layers 14. Therefore, as observed along the first direction H1, which is the length direction of the first parallel wiring portions 14B, characteristics, such as characteristic impedance, of the first parallel wiring portions 14B hardly vary.

Further, the first through holes 12B are elongated in the direction parallel to the first direction H1. Even though through holes are not formed in the first parallel wiring correspondence portions 12C, the elongated shape of the first through holes 12B provided in the first parallel-wiring-gap correspondence portions 12D enhances the bonding strength between the core substrate 11 and the first dielectric layer 13. Also, since gas to be generated from the core substrate 11 can be released through the first elongated through holes 12B, generation of blisters can be prevented in the vicinity of the first elongated through holes 12B, at the interface between the core substrate 11 and the first conductor layer 12, specifically, at the interface between the core substrate 11 and the first parallel wiring correspondence portions 12C and between the core substrate 11 and the first parallel-wiring-gap correspondence portions 12D.

Particularly, since the first parallel-wiring-gap correspondence portions 12D are each interposed between two first parallel wiring correspondence portions 12C, when through holes are to be arranged in the first parallel-wiring-gap correspondence portions 12D, the through holes are limited in a dimension as measured along the direction perpendicular to the first direction H1. Accordingly, circular or square through holes encounter difficulty in providing a sufficient opening area. However, according to the present embodiment, the first through holes 12B have an elongated shape and thus can provide a sufficient opening area, thereby enhancing the bonding strength between the core substrate 11 and the first dielectric layer 13 and reliably preventing generation of blisters at the interface between the core substrate 11 and the first parallel wiring correspondence portions 12C and between the core substrate 11 and the first parallel-wiring-gap correspondence portions 12D.

Figure 4:
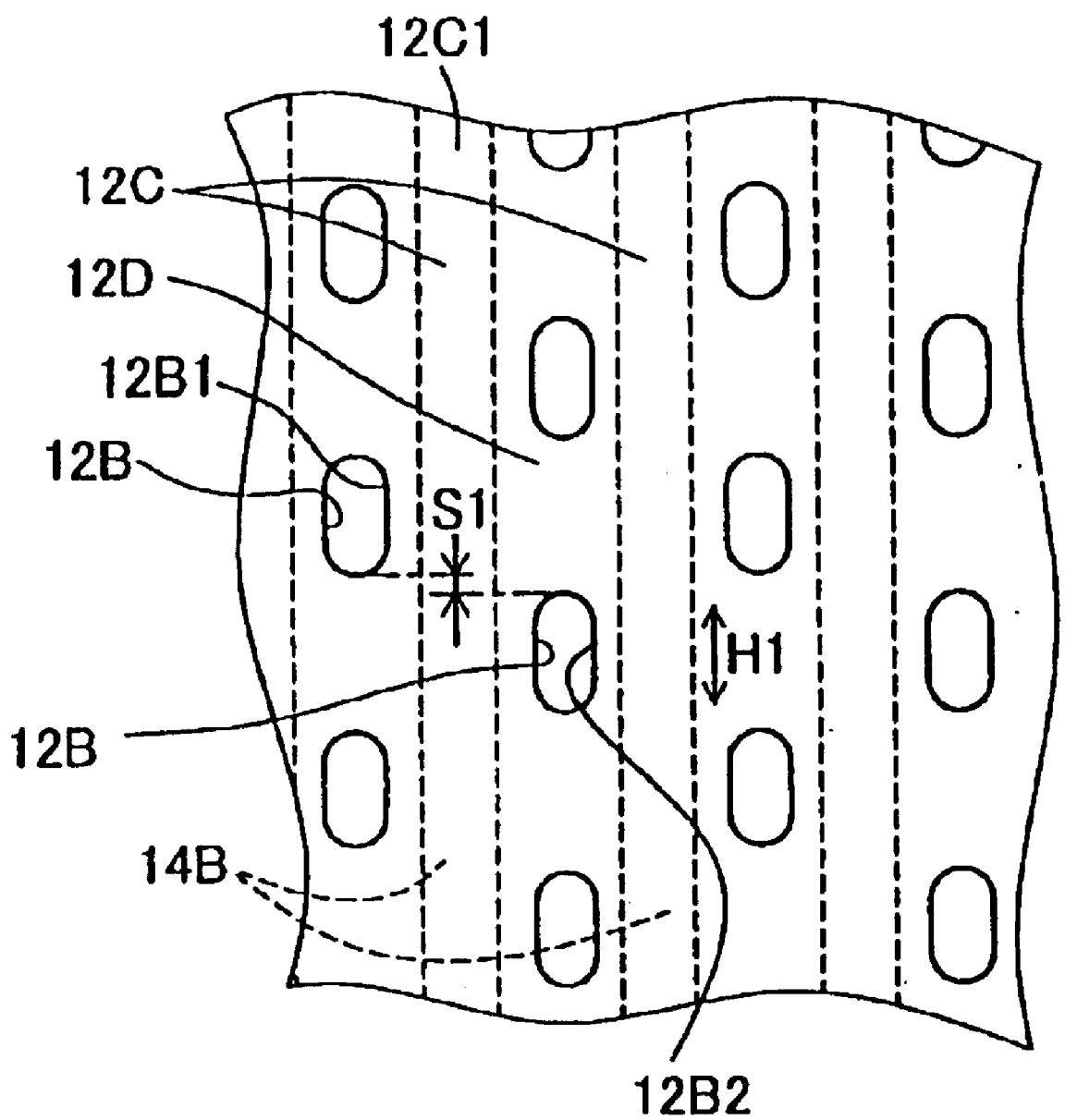
FIG. 4 is a partially enlarged sectional view showing in a planar form a portion of the first conductor layer in a further enlarged condition.

Further, as shown in the enlarged view of FIG. 4, the first elongated through holes 12B are arranged such that left-hand elongated through holes 12B1, which are located on one side (to the left in FIG. 4) of a certain first parallel wiring correspondence portion 12C1, and right-hand elongated through holes 12B2, which are located on the opposite side (to the right in FIG. 4) of the first parallel wiring correspondence portion 12C1, are arranged in a staggered condition, not in a laterally aligned condition. Further, the left-hand elongated through holes 12B1 and the right-hand elongated through holes 12B2 are arranged such that a gap S1 is formed therebetween along the first direction H1.

Since the first conductor layer 12 is used as a ground layer, current flows therethrough in a planar direction. Preferably, the resistance of the ground layer itself is as low as possible. If the left-hand elongated through holes 12B1 and the right-hand elongated through holes 12B2 are arranged in a laterally aligned condition, the left-hand and right-hand elongated through holes 12B1 and 12B2 that are laterally aligned with each other define a narrow gap therebetween. As a result, at portions of the first conductor layer 12 which are each interposed between two aligned elongated through holes 12B1 and 12B2, the path of current is narrowed, resulting in an increase in resistance at the portions.

By contrast, in the wiring substrate 10, the left-hand elongated through holes 12B1 and the right-hand elongated through holes 12B2 are arranged in a staggered condition, not in a laterally aligned condition. Further, the left-hand elongated through holes 12B1 and the right-hand elongated through holes 12B2 are arranged such that the gap S1 is formed therebetween along the first direction H1. Accordingly, narrowing of the path of current, which would otherwise result from two elongated through holes 12B1 and 12B2 defining a narrow portion therebetween, is prevented, thereby retaining the resistance of the first conductor layer 12 at low level.

Next, the second parallel wiring correspondence portions 12F and the second parallel-wiring-gap correspondence portions 12G will be discussed. As shown in FIG. 3, the second elongated through holes 12E are formed in the second parallel-wiring-gap correspondence portions 12G. The second elongated through holes 12E are interposed between the second parallel wiring correspondence portions 12F. Therefore, as observed along the second direction H2, which is the length direction of the second parallel wiring portions 14C, characteristics, such as characteristic impedance, of the second parallel wiring portions 14C hardly vary.

Further, the second through holes 12E are elongated in the direction parallel to the second direction H2. Thus, even though through holes are not formed in the second parallel wiring correspondence portions 12F, the elongated shape of the second through holes 12E in the second parallel-wiring-gap correspondence portions 12G enhances the bonding strength between the core substrate 11 and the first dielectric layer 13. Also, since gas to be generated from the core substrate 11 can be released through the second elongated through holes 12E, generation of blisters can be prevented, in the vicinity of the second elongated through holes 12E, at the interface between the core substrate 11 and the second parallel wiring correspondence portions 12F and between the core substrate 11 and the second parallel-wiring-gap correspondence portions 12G.

Particularly, since the second parallel-wiring-gap correspondence portions 12G are each interposed between two second parallel wiring correspondence portions 12F, when through holes are to be arranged in the second parallel-wiring-gap correspondence portions 12G, the through holes are limited in a dimension as measured along the direction perpendicular to the second direction H2. Accordingly, circular or square through holes encounter difficulty in providing a sufficient opening area. However, according to the present embodiment, the second through holes 12E have an elongated shape and thus can provide a sufficient opening area, thereby enhancing the bonding strength between the core substrate 11 and the first dielectric layer 13 and reliably preventing generation of blisters at the interface between the core substrate 11 and the second parallel wiring correspondence portions 12F and between the core substrate 11 and the second parallel-wiring-gap correspondence portions 12G.

As shown in FIG. 3, two second elongated through holes 12E, which are located on opposite sides of a certain second parallel wiring correspondence portion 12F, are arranged in a staggered condition, not in a laterally aligned condition. Further, a gap S2 is formed along the second direction H2 between two second elongated through holes 12E that are arranged adjacent to each other in a staggered condition.

Accordingly, in the first conductor layer 12, narrowing of the path of current, which would otherwise result from two aligned second elongated through holes 12E defining a narrow portion therebetween, is prevented, thereby retaining the resistance of the first conductor layer 12 at low level.

Further, as shown in FIG. 3, the second elongated through holes 12E are greater in opening area than the first elongated through holes 12B. This is because, as mentioned previously, in the signal wiring layers 14, the adjacent second parallel wiring portions 14C are spaced at the second gap D2, which is greater than the first gap D1 at which the adjacent first parallel wiring portions 14B are spaced (see FIG. 2). Accordingly, the gap between adjacent second parallel wiring correspondence portions 12F corresponding to the adjacent second parallel wiring portions 14C (i.e., the width of the second parallel-wiring-gap correspondence portion 12G) is greater than that of the first parallel-wiring-gap correspondence portion 12D. If through holes similar to the first elongated through holes 12B are formed in the second parallel-wiring-gap correspondence portions 12G, the gap between adjacent through holes increases accordingly, resulting in a reduction in opening area of through holes per unit of area (opening percentage), which would in turn impair the bonding strength and gas release properties. By contrast, according to the present embodiment, the second elongated through holes 12E assume a relatively large opening area, thereby preventing a reduction in opening percentage and maintaining good bonding and gas release properties. In view of boding properties and gas release properties, preferably, the opening percentage is not less than 16% at any position on the first conductor layer 12.

Next, the third parallel wiring correspondence portions 12I and the third parallel-wiring-gap correspondence portions 12J will be discussed. As shown in FIG. 3, the third parallel wiring correspondence portions 12I, the third parallel-wiring-gap correspondence portions 12J, and the third elongated through holes 12H formed in the third parallel-wiring-gap correspondence portions 12J are substantially similar in mutual relationship to the second parallel wiring correspondence portions 12F, the second parallel-wiring-gap correspondence portions 12G, and the second elongated through holes 12E. Therefore, similar features will be described in a brief manner.

Since the third elongated through holes 12H are formed in the third parallel-wiring-gap correspondence portions 12J, as observed along a third direction H3, which is the length direction of the third parallel wiring portions 14D, characteristics, such as characteristic impedance, of the third parallel wiring portions 14D hardly vary.

Further, the third through holes 12E are elongated in the direction parallel to the third direction H3. Thus, formation of the third elongated through holes 12H in the third parallel-wiring-gap correspondence portions 12J enhances the bonding strength between the core substrate 11 and the first dielectric layer 13. Also, since gas can be released through the third elongated through holes 12H, generation of blisters can be prevented in the vicinity of the third elongated through holes 12H, at the interface between the core substrate 11 and the third parallel wiring correspondence portions 12I and between the core substrate 11 and the third parallel-wiring-gap correspondence portions 12J.

Particularly, when through holes are to be arranged in the third parallel-wiring-gap correspondence portions 12J, the through holes are limited in a dimension as measured along the direction perpendicular to the third direction H3. However, in the wiring substrate 10, the third through holes 12H have an elongated shape and thus can provide a sufficient opening area, thereby enhancing the bonding strength between the core substrate 11 and the first dielectric layer 13 and reliably preventing generation of blisters at the interface between the core substrate 11 and the third parallel wiring correspondence portions 12I and between the core substrate 11 and the third parallel-wiring-gap correspondence portions 12J.

Further, as shown in FIG. 3, two third elongated through holes 12H, which are located on opposite sides of a certain third parallel wiring correspondence portion 12I, are arranged in a staggered condition. Also, a gap S3 is formed along the third direction H3 between two third elongated through holes 12H that are arranged adjacent to each other in a staggered condition.

Accordingly, narrowing of the path of current, which would otherwise result from two aligned elongated third through holes 12H defining a narrow portion therebetween, is prevented, thereby retaining the resistance of the first conductor layer 12 at low level.

Further, as shown in FIG. 3, the third elongated through holes 12H are also greater in opening area than the first elongated through holes 12B. If through holes similar to the first elongated through holes 12B are formed in the third parallel-wiring-gap correspondence portions 12I, the opening percentage decreases, and thus bonding strength and gas release properties are impaired. By contrast, in the wiring substrate 10, the third elongated through holes 12H assume a relatively large opening area, thereby preventing a reduction in opening percentage and maintaining good bonding and gas release properties.

Notably, in the residual portion 12K (e.g., a central lower portion in FIG. 3), which is a portion of the wiring noncorrespondence region of the first conductor layer 12, the circular through holes 12L may be arranged in a lattice pattern as conventionally practiced, for the following reason. Since the signal wiring layers 14 do not extend above the residual portion 12K, the residual portion 12K is not subjected to restrictions on the arrangement of through holes, which restrictions are imposed by the wiring correspondence region, such as the first parallel wiring correspondence portions 12C.

As in the case of the first conductor layer 12, the arrangement of through holes to be formed in the second conductor layer 16 is determined in view of the positional relation to the signal wiring layers 14. Specifically, the through holes are not formed in the wiring correspondence region, which corresponds to the signal wiring layers 14 as projected along the thickness direction, but are formed in the wiring noncorrespondence region. For example, the first through holes 16B are formed in the first parallel-wiring-gap correspondence portions 16D, not in the first parallel wiring corresponding portion 16C.

Thus, variations in characteristics, such as characteristic impedance, of the signal wiring layers 14 as observed along the length direction of the signal wiring layers 14 can be restrained. Further, the bonding between the second dielectric layer 15 and the third dielectric layer 17 can be enhanced, and the through holes 16B effect good gas release properties to thereby prevent generation of blisters at the interface between the second dielectric layer 15 and the second conductor layer 16.

The wiring substrate 10 may be fabricated by use of a known build-up process. For example, unillustrated through holes are formed in the core substrate 11, which is covered at opposite sides with copper foil applied through bonding, and are then plated to become plated through holes ("PTH's"). The plated through holes are filled with a filler resin. Next, the copper foil (a copper layer) on the front side is formed into a predetermined pattern through etching to thereby form the first conductor layer 12. Subsequently, the first dielectric layer 13 is formed, and then unillustrated via holes are formed therein as needed, followed by formation of via conductors. Then, the signal wiring layers 14 in a predetermined pattern are formed by use of a semi-additive process or a like process. Similarly, the second dielectric layer 15 is formed, and unillustrated via holes and via conductors are formed therein as needed, followed by formation of the second conductor layer 16 in a predetermined pattern.

Subsequently, the third dielectric layer 17 is formed, thereby completing the wiring substrate 10. Notably, a similar fabrication process is performed on the back side of the core substrate 1.

Embodiment 2

A second embodiment of the present invention is depicted in FIG. 5. The wiring substrate 20 of Embodiment 2 has a structure that is similar to the structure of the wiring substrate 10 of Embodiment 1 (see FIG. 1). For convenience, the differences between the two embodiments will be described, whereas description of similar features will be omitted or briefed.

FIG. 5 shows a conductor layer 22 in a planar form. The conductor layer 22 includes (1) wiring correspondence regions 22C, which correspond to signal wiring layers 24 (represented by dashed lines in FIG. 5), as projected thereon along the thickness direction, and (2) a wiring noncorrespondence region 22D, which is the portion of the conductor layer 22 other than the wiring correspondence regions 22C. The wiring noncorrespondence region 22D is divided into (a) side portions 22E, which are delimited by the dashed line and the dot-and-dash line and are located on opposite sides of each wiring correspondence region 22C, and (b) a residual portion 22F.

To enhance the bonding strength between the overlying and underlying dielectric layers as well as to improve gas release properties for the purpose of preventing generation of blisters, through holes are formed in the conductor layer 22. As in the case of Embodiment 1, through holes are formed in the wiring noncorrespondence region 22D, which is the region surrounding the wiring correspondence regions 22C. Specifically, elongated through holes 22B are formed in the side portions 22E, and circular through holes 22G are formed in the residual portion 22F.

That is, no through holes are formed in the wiring correspondence regions 22C of the conductor layer 22, which is to be electromagnetically coupled with the signal wiring layers 24, under which the wiring correspondence regions 22C are located. Accordingly, variations in characteristics, such as characteristic impedance, of the signal wiring layers 24 as observed along the length direction of the signal wiring layers 24 are restrained.

In the wiring substrate 20, the through holes 22B, which are formed in the side portions 22E extending along the wiring correspondence regions 22C, are elongated in the length direction of the signal wiring layers 24.

Since through holes are not formed in the wiring correspondence regions 22C, the bonding strength and gas release properties may be impaired in the wiring correspondence regions 22C. However, the elongated through holes 22B in the side portions 22E extend along the wiring correspondence regions 22C. The shape and orientation of the elongated through holes 22B enhances the bonding strength in the vicinity of the wiring correspondence regions 22C and enhances gas release properties to thereby prevent generation of blisters at the interface between the conductor layer 22 and the dielectric layer that underlies the conductor layer 22.

Particularly, in the wiring substrate 20, the through holes 22B formed in the side portions 22E have an elongated shape and thus can provide a relatively large opening area along the wiring correspondence regions 22C, thereby enhancing the bonding strength and reliably preventing generation of blisters because of enhanced gas release properties.

In the residual portion 22F, the through holes 22G may be arranged, for example, in a lattice pattern as conventionally practiced, since the residual portion 22F is not subjected to restrictions on the arrangement of through holes, which restrictions are imposed in relation to the wiring correspondence regions 22C.

The wiring substrate 20 may be fabricated in a manner similar to that of Embodiment 1.

While the present invention has been described with reference to Embodiments 1 and 2, the present invention is not limited thereto, but may be modified as appropriate without departing from the spirit or scope of the invention.

For example, Embodiment 1 is described while mentioning the wiring substrate 10 including the signal wiring layers 14 which are configured such that a number of first and second parallel wiring portions 14B and 14C (or a number of first and third parallel wiring portions 14B and 14D) are arranged in parallel with one another. However, the arrangement of the through holes may be designed such that the through holes are formed in a wiring noncorrespondence region of a conductor layer that surrounds a wiring correspondence region, which corresponds to a certain signal wiring layer as projected on the conductor layer. In this case, there can be restrained variations in characteristics, such as characteristic impedance, of the signal wiring layer as observed along the length direction of the signal wiring layer.

Embodiment 1 is described while mentioning the first conductor layer 12 formed on the front surface 11B of the core substrate 11 formed of a glass-epoxy-resin composite material (see FIG. 1). However, a dielectric layer that underlies the first conductor layer may be formed of a resin, such as epoxy resin, as in the case of the first dielectric layer 13.

Embodiment 1 is described while mentioning signal transmission paths in a strip line structure implemented through sandwiching of the signal wiring layers 14 between the first and second conductor layers 12 and 16. However, signal transmission paths in other forms, such as signal transmission paths in a microstrip line structure, may be applied to the present invention. A specific example of such a wiring substrate is such that in the wiring substrate 10 of Embodiment 1 (see FIG. 1), the second conductor layer 16 is removed.

Embodiments 1 and 2 are described as employing dielectric layers formed from epoxy resin or a glass-epoxy-resin composite material, and metal layers formed from copper to serve as conductor layers and signal wiring layers. However, the present invention can be applied to a wiring substrate that employs dielectric layers formed from ceramic, such as alumina, aluminum nitride, or glass-ceramic, and metal layers formed from a metal compatible with ceramic, such as tungsten, molybdenum, copper, or silver, for use as conductor layers and signal wiring layers. Such a ceramic wiring substrate may be fabricated by a known process; for example, a process in which dielectric layers, conductor layers, and signal wiring layers are simultaneously formed through simultaneous firing and a process in which dielectric layers and metal layers are sequentially arranged in layers.

This application is based on Japanese Patent Application No. 2001-126273 filed Apr. 24, 2001, the disclosure of which is incorporated herein by reference in its entirety.

What is claimed is:

1. A wiring substrate having a layered structure comprising:

a conductor layer having a plurality of through holes that extend in a thickness direction of said conductor layer;

a dielectric layer in contact with said conductor layer; and a signal wiring layer positioned in opposition to said conductor layer via said dielectric layer, said signal wiring layer adapted to transmit a signal;

wherein said conductor layer includes
  (1) a wiring correspondence region corresponding to said signal wiring layer as projected onto said conductor layer in the thickness direction; and
  (2) a wiring noncorrespondence region, which is the remaining portion of said conductor layer not including the wiring correspondence region;

wherein the through holes are arranged in the wiring noncorrespondence region of said conductor layer; and wherein no through holes are arranged in the wiring correspondence region.

2. The wiring substrate as claimed in claim 1, wherein at least one of the through holes is formed in a side portion of the wiring noncorrespondence region, the side portion being contiguous with and extending along the wiring correspondence region.

3. The wiring substrate as claimed in claim 2, wherein the at least one through hole formed in the side portion has a shape that is elongated in a direction that is parallel to a length direction of said signal wiring layer.

4. A wiring substrate having a layered structure comprising:

a conductor layer having a plurality of through holes that extend in a thickness direction of said conductor layer;

a dielectric layer in contact with said conductor layer; and a plurality of signal wiring layers positioned in opposition to said conductor layer via said dielectric layer, said signal wiring layers adapted to transmit signals;

wherein said conductor layer includes
  (1) a plurality of wiring correspondence regions respectively corresponding to said signal wiring layers as projected onto said conductor layer in the thickness direction; and
  (2) a wiring noncorrespondence region, which is the remaining portion of said conductor layer not including the wiring correspondence regions;

wherein the through holes are arranged in the wiring noncorrespondence region of said conductor layer;

wherein the signal wiring layers include parallel wiring portions extending in parallel with one another and located adjacent to one another;

wherein the wiring correspondence regions include parallel wiring correspondence portions corresponding to the parallel wiring portions;

wherein the wiring noncorrespondence region includes parallel-wiring-gap correspondence portions that are respectively interposed between the parallel wiring correspondence portions;

wherein the through holes that are arranged in the parallel-wiring-gap correspondence portions have a shape that is elongated in a direction that is parallel to a length direction of the parallel wiring portions of said signal wiring layers; and wherein no through holes are arranged in the wiring correspondence regions.

5. The wiring substrate as claimed in claim 4, wherein the elongated through holes that are located on opposite sides of at least one of said parallel wiring correspondence portions are staggered along the length direction.

6. The wiring substrate as claimed in claim 5, wherein a gap is formed along the length direction between adjacent elongated through holes that are located on opposite sides of said at least one parallel wiring correspondence portion.

7. A wiring substrate having a layered structure comprising:

a conductor layer having a plurality of through holes that extend in a thickness direction of said conductor layer;

a dielectric layer in contact with said conductor layer; and a plurality of signal wiring layers positioned in opposition to said conductor layer via said dielectric layer, said signal wiring layers adapted to transmit signals;

wherein said conductor layer includes
  (1) a plurality of wiring correspondence regions corresponding to said signal wiring layers as projected onto said conductor layer in the thickness direction; and
  (2) a wiring noncorrespondence region, which is the remaining portion of said conductor layer not including the wiring correspondence regions;

wherein the through holes are arranged in the wiring noncorrespondence region of said conductor layer;

wherein the signal wiring layers include
  (1) first parallel wiring portions extending in parallel with one another such that a first gap is formed between the adjacent first parallel wiring portions; and
  (2) second parallel wiring portions extending in parallel with one another, and forming a predetermined angle with respect to the first parallel wiring portions, and a second gap greater than the first gap is formed between the adjacent second parallel wiring portions;

wherein the wiring correspondence regions include
  (1) first parallel wiring correspondence portions corresponding to the first parallel wiring portions; and
  (2) second parallel wiring correspondence portions corresponding to the second parallel wiring portions;

wherein the wiring noncorrespondence region includes
  (1) first parallel-wiring-gap correspondence portions interposed between the first parallel wiring correspondence portions; and
  (2) second parallel-wiring-gap correspondence portions interposed between the second parallel wiring correspondence portions;

wherein the through holes that are arranged in the first parallel-wiring-gap correspondence portions are first through holes that have a shape that is elongated in a direction parallel to a first length direction of the first parallel wiring portions of said signal wiring layers; and wherein the through holes are arranged in the second parallel-wiring-gap correspondence portions are second through holes that have a shape that is elongated in a direction parallel to a second length direction of the second parallel wiring portions of said signal wiring layers, and have an opening area greater than that of the first through holes.

8. The wiring substrate as claimed in claim 7, wherein no through holes are arranged in the wiring correspondence regions.

* * * * *